(12) United States Patent  (10) Patent No.: US 7,579,749 B2
Murata et al.  (45) Date of Patent: Aug. 25, 2009

(54) POWER SUPPLY DEVICE AND IMAGE FORMING APPARATUS USING THE POWER SUPPLY DEVICE

(75) Inventors: Hiroki Murata, Sunto-gun (JP);
Teruhiko Namiki, Mishima (JP);
Osamu Nagasaki, Numazu (JP);
Atsuhiko Yamaguchi, Izu (JP);
Tomohiro Nakamori, Yokohama (JP);
Takehiro Uchiyama, Sunto-gun (JP);
Kouji Yasukawa, Susono (JP)

(73) Assignee: Canon Kabushiki Kaisha, Tokyo (JP)

( * ) Notice: Subject to any disclaimer, the term of this patent is extended or adjusted under 35 U.S.C. 154(b) by 187 days.

(21) Appl. No.: 11/456,049

(22) Filed: Jul. 6, 2006

(65) Prior Publication Data

US 2007/0007855 A1 Jan. 11, 2007

(30) Foreign Application Priority Data

Jul. 8, 2005 (JP) .............................. 2005-200646

(51) Int. Cl.
*H01L 41/08* (2006.01)
(52) U.S. Cl. .................................. 310/316.01; 310/317
(58) Field of Classification Search ............ 310/316.01, 310/317, 319
See application file for complete search history.

(56) References Cited

U.S. PATENT DOCUMENTS

| 5,654,605 | A | * | 8/1997 | Kawashima | 310/316.01 |
|---|---|---|---|---|---|
| 5,731,652 | A | * | 3/1998 | Shimada | 310/316.01 |
| 6,028,388 | A | * | 2/2000 | Shimada | 310/318 |
| 6,044,003 | A | * | 3/2000 | Toshinari et al. | 363/97 |
| 6,144,139 | A | * | 11/2000 | Noma et al. | 310/316.01 |
| 6,268,681 | B1 | * | 7/2001 | Yamaguchi et al. | 310/316.01 |
| 6,509,671 | B2 | * | 1/2003 | Takeda et al. | 310/316.01 |
| 6,583,534 | B1 | * | 6/2003 | Nakatsuka et al. | 310/359 |
| 6,654,221 | B2 | * | 11/2003 | Noma et al. | 361/91.1 |
| 6,720,705 | B2 | * | 4/2004 | Nakatsuka et al. | 310/316.01 |
| 6,794,794 | B2 | * | 9/2004 | Klement | 310/311 |
| 6,794,796 | B2 | * | 9/2004 | Nakatsuka et al. | 310/316.01 |
| 6,911,786 | B2 | * | 6/2005 | Qiu | 315/209 PZ |
| 7,196,475 | B2 | * | 3/2007 | Saito et al. | 315/55 |

FOREIGN PATENT DOCUMENTS

JP H03-022873 A 1/1991
JP 11-206113 A 7/1999

* cited by examiner

*Primary Examiner*—Mark Budd
(74) *Attorney, Agent, or Firm*—Canon USA Inc IP Division

(57) ABSTRACT

A power supply device generates an output voltage by driving a piezoelectric transformer using a frequency signal. The power supply device includes a comparison unit configured to compare an output voltage and a voltage setting signal that sets the output voltage, and a voltage control oscillation unit configured to generate the frequency signal to drive the piezoelectric transformer based on comparison results of the comparison unit. The voltage control oscillation unit generates the frequency signal within a range between the resonant frequency and a spurious resonant frequency closest to the resonant frequency.

22 Claims, 11 Drawing Sheets

POWER SUPPLY DEVICE AND IMAGE FORMING APPARATUS USING THE POWER SUPPLY DEVICE

BACKGROUND OF THE INVENTION

1. Field of the Invention

The present invention relates to a power supply device, for example, for an image forming apparatus using an electrophotographic process, and an image forming apparatus using the power supply device.

2. Description of the Related Art

In the technology of an electrophotographic printer, a direct transfer method is known in which a transfer roller is brought into contact with a photoreceptor and an image is transferred onto a record sheet inserted between the photoreceptor and the transfer roller. In this case, roller-shaped conductive rubber having a conductive axis is used as the transfer roller and the roller is driven corresponding to a process speed of the photoreceptor. Then, a direct bias voltage is applied to the transfer roller. Polarities of the direct bias voltage are the same as those of a normal corona discharge transfer voltage. However, to obtain excellent transfer when using such a transfer roller, a voltage equal to or more than 3 kV (prescribed current: several µA) is preferably applied to the transfer roller. To generate such a high voltage, a winding electromagnetic transformer has been conventionally used. However, such a transformer is configured of copper wires, bins, and magnetic cores, and if the transformer is used according to the aforementioned specifications, a leakage current in each section is preferably minimized to the fullest extent possible since an output current value is a micro current of the order of several µA. Thus, the transformer winding is preferably molded with insulating material, and in addition, a large-capacity transformer is needed compared with supply power, which prevents reduction in size and weight of high voltage power supply devices. A typical electrophotographic printer has, in addition to the aforementioned transfer, various units requiring high voltages, for example, for primary charge of a photoconductor drum, development, and as required, fixing bias, and secondary transfer in a case of using an intermediate transfer member. Furthermore, in some color printers, such units are provided for each color station and, as a result, many transformers are mounted. Thus, if winding electromagnetic transformers are used, it is difficult to achieve reduction in size and weight of the whole apparatus.

To overcome these shortcomings, using a thin, light, and high voltage piezoelectric transformer to generate a high voltage has been proposed. As an example, it has been suggested that by using a piezoelectric transformer made of ceramics, a high voltage can be generated more efficiently than an electromagnetic transformer. Moreover, in the case of the piezoelectric transformer, since primary and secondary electrodes can be located away from each other regardless of coupling between them, no special molding for insulation is needed and thus a high voltage power supply can be made smaller and lighter.

FIG. 10 is a diagram illustrating an example of a conventional high voltage power supply circuit using a piezoelectric transformer 101. Such a high voltage power supply circuit is discussed in Japanese Patent Application Laid-Open No. 11-206113.

Reference numeral 101 denotes a piezoelectric transformer (piezoelectric ceramic transformer) of high voltage power supply. Output of the piezoelectric transformer 101 is rectified and smoothed to a positive voltage by diodes 102 and 103 and a high voltage capacitor 104, and then supplied to a transfer roller (not shown), which serves as a load. This output voltage $V_{out}$ is divided by resistors 105, 106, and 107, and is input as a detection signal ($V_{sns}$) to a non-inverting input terminal (positive terminal) of an operational amplifier 109 via a protective resistor 108. On the other hand, a control signal ($V_{cont}$) of high voltage power supply, which is an analog signal, is input to an inverting input terminal (negative terminal) of the operational amplifier 109 from a control board via a resistor 114. The operational amplifier 109, resistor 114, and capacitor 113 function as an integrating circuit and a control signal $V_{cont}$ blunted by an integration time constant that is determined by resistance and capacitance of the resistor 114 and capacitor 113, is input to the operational amplifier 109. In addition, output of the operational amplifier 109 is connected to a voltage controlled oscillator (VCO) 110. Power is supplied to a primary side of the piezoelectric transformer 101 by driving a transistor 111 connected to an inductor 112 using the output of the VCO 110.

FIG. 11 is a diagram illustrating characteristics of the piezoelectric transformer 101.

In the diagram, the characteristics show a trailing shape so that the output voltage is at its maximum at resonant frequency f0 and enables control of the output voltage by frequency. When the output voltage is controlled using frequencies higher than the resonant frequency f0, it is evident from the diagram that drive frequencies should be changed from higher to lower frequencies to raise the output voltage of the piezoelectric transformer 101.

As shown in FIG. 11, in addition to the resonant frequency f0, a spurious resonant frequency (henceforth referred to as a spurious frequency) occurs in the piezoelectric transformer 101 due to structural characteristics of the piezoelectric transformer 101. In a case of sweeping from a sufficiently high drive frequency to a drive frequency of the piezoelectric transformer to obtain a desired output voltage near the resonant frequency f0, a micro output voltage is generated in the course of passing each spurious frequency. This delays the sweep time of frequency and the rise time of a high voltage output becomes longer. More details will be described below.

FIG. 10 shows a configuration in which an output voltage value of the operational amplifier 109 determines an oscillating frequency of the VCO circuit 110. A sweep time is defined as time until the output voltage value of the operational amplifier 109 matches the desired voltage value, that is, until the oscillating frequency of the VCO circuit 110 is fixed to the desired oscillating frequency. The operational amplifier 109 receives the voltage of the control signal $V_{cont}$ from the control board via the inverting input terminal (negative terminal) and receives the detection signal $V_{sns}$ via the non-inverting input terminal (positive terminal). Then, an output voltage $V_{opout}$ of the operational amplifier 109 is determined by a difference of voltage value between the control signal $V_{cont}$ and detection signal $V_{sns}$, and the sweep time of the oscillating frequency is determined by the output voltage $V_{opout}$.

FIG. 12 is a diagram illustrating output voltage-time characteristics of a conventional high voltage power supply of the piezoelectric transformer type.

Reference numeral 1201 denotes a waveform of the control signal $V_{cont}$ of the high voltage power supply and Reference numeral 1202 denotes a waveform of the output voltage $V_{opout}$ of the operational amplifier 109, and Reference numeral 1203 denotes a waveform of the output voltage $V_{out}$. Reference numeral 1210 denotes timing when the high voltage power supply device is turned on, and Reference numerals 1211 and 1212 denote the time when each spurious frequency is passed during the rise time of the output voltage. As shown in Reference numeral 1203, the waveform of the output voltage $V_{out}$ indicates that a micro output voltage is generated when each spurious frequency (1211 and 1212) is passed in a process of sweeping through drive frequencies. Then, the detection signal value $V_{sns}$ based on the output voltage value is input to the operational amplifier 109 and the output voltage $V_{opout}$ (1202) of the operational amplifier 109 rises. Accordingly, the sweep time of the oscillating frequency becomes longer. Thus, the delay of the rise time resulting from spurious frequencies occurs between the time when the high voltage power supply is ON and the control signal $V_{cont}$ is input to the operational amplifier (1210), and the time when the output voltage reaches the desired output setting voltage.

SUMMARY OF THE INVENTION

Embodiments of the present invention provide a power supply device that enables shortening of a rise time of high voltage and an image forming apparatus that employs the power supply device.

According to an aspect of the present invention, an embodiment is directed to a power supply device that generates an output voltage by driving a piezoelectric transformer using a frequency signal. The power supply device includes a comparison unit configured to compare the output voltage and a voltage setting signal that sets the output voltage, and a voltage control oscillation unit configured to generate the frequency signal to drive the piezoelectric transformer based on comparison results of the comparison unit. The voltage control oscillation unit generates the frequency signal in a frequency region higher than a resonant frequency of the piezoelectric transformer within a range between the resonant frequency and a spurious resonant frequency closest to the resonant frequency.

According to another aspect of the present invention, an embodiment is directed to a power supply device that generates the output voltage by driving the piezoelectric transformer using the frequency signal. The power supply device includes a comparison unit configured to compare the output voltage and the voltage setting signal that sets the output voltage, and a voltage control oscillation unit configured to generate the frequency signal to drive the piezoelectric transformer based on comparison results of the comparison unit. The voltage control oscillation unit generates the frequency signal in a frequency region lower than the resonant frequency of the piezoelectric transformer within the range between the resonant frequency and a spurious resonant frequency closest to the resonant frequency.

According to yet another aspect of the present invention, an embodiment is directed to an image forming apparatus that includes a latent image forming unit configured to form an electrostatic latent image on an image carrier, a development unit configured to form a toner image of the electrostatic latent image, a transfer unit configured to transfer the toner image onto a transfer member, a fixing unit configured to fix the toner image by heating the transfer member onto which the toner image has been transferred, a transport unit configured to transport the transfer member, and a power supply device. The power supply device generates an output voltage by driving a piezoelectric transformer using a frequency signal and supplies the output voltage to at least one of the development unit, transfer unit, and fusing unit. The power supply device includes a comparison unit configured to compare the output voltage and a voltage setting signal to set the output voltage. The voltage control oscillation unit is configured to generate the frequency signal to drive the piezoelectric transformer based on comparison results of the compari-son unit. The voltage control oscillation unit generates the frequency signal in a frequency region higher than a resonant frequency of the piezoelectric transformer within a range between the resonant frequency and a spurious resonant frequency closest to the resonant frequency, or in a frequency region lower than the resonant frequency of the piezoelectric transformer within a range between the resonant frequency and a spurious resonant frequency closest to the resonant frequency.

According to an embodiment of the present invention, the rise time of the output voltage can be shortened by setting a lower limit or higher limit of the piezoelectric transformer drive frequency while avoiding the spurious frequency that is closest to the resonant frequency of the piezoelectric transformer.

Further features of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments of the invention and, together with the description, serve to explain the principles of the invention. It is noted that the references to "an" or "one" embodiment of this disclosure are not necessarily directed to the same embodiment, and such references mean at least one.

DETAILED DESCRIPTION OF THE EXEMPLARY EMBODIMENTS

Detailed descriptions of exemplary embodiments of the present invention will be described below with reference to attached drawings.

First, a configuration of a color laser printer according to exemplary embodiments will be described with reference to FIG. 9.

Figure 9:
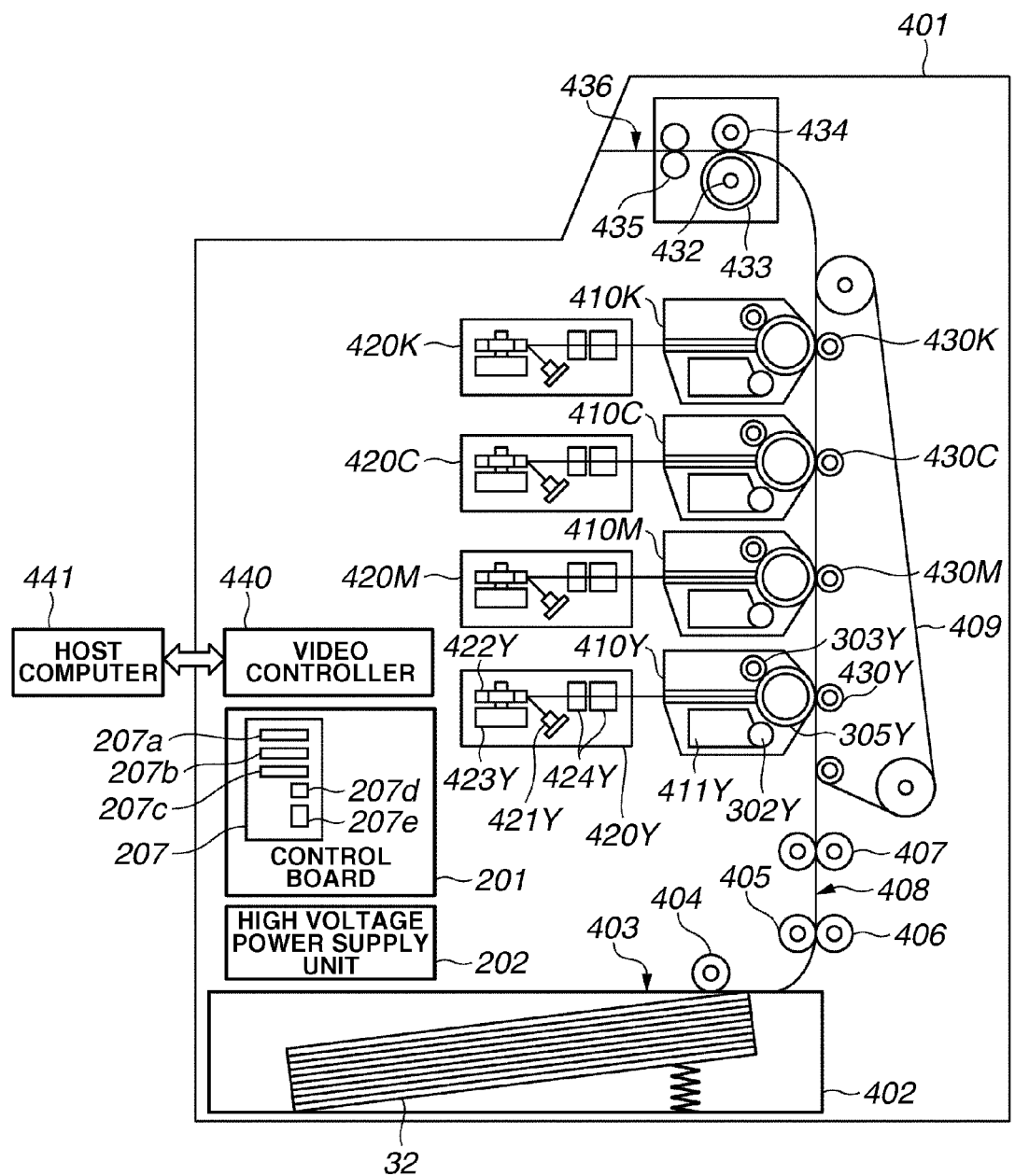
FIG. 9 is a schematic sectional view illustrating a configuration of a color laser printer (image forming apparatus) according to exemplary embodiments of the present invention.
Figure 10:
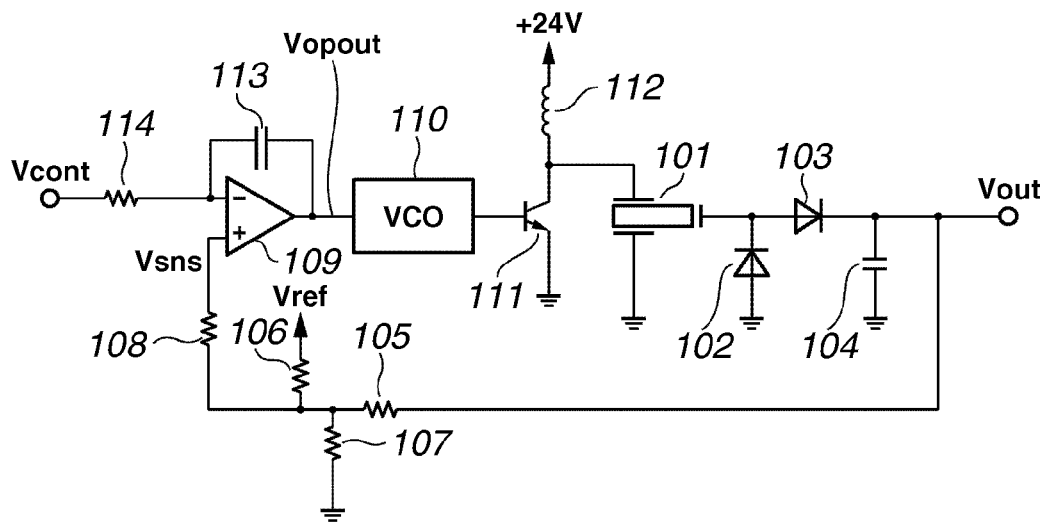
FIG. 10 is a diagram illustrating an example of a conventional high voltage power supply circuit using the piezoelectric transformer.

FIG. 9 is the schematic sectional view illustrating the configuration of a color laser printer (image forming apparatus) 401 according to the exemplary embodiments of the present invention.

The laser printer 401 includes a deck (paper cassette) 402 to hold record sheets 32, which serve as a recording medium. A deck paper sensor 403 detects presence/absence of the record sheets 32 in the deck 402. A pickup roller 404 separates one sheet of the record sheet 32 after another from the deck 402 through its rotation and forwards the sheet. A deck feed roller 405 transports the record sheet 32 forwarded by the pickup roller 404. A retard roller 406 pairs up with the deck feed roller 405 to prevent double feed of the record sheets 32. At a downstream of the deck feed roller 405, a registration roller pair 407 that carries out synchronous transportation of the record sheet 32 and a pre-registration sensor 408 that detects transportation status of the record sheet 32 being transported to the registration roller pair 407, are disposed.

At a downstream of the registration roller pair 407, an electrostatic adsorption transport transfer belt (henceforth referred to as ETB) 409 is disposed. Then, images are formed by image formation units which include process cartridges 410Y, 410M, 410C, and 410K and scanner units 420Y, 420M, 420C, and 420K for four colors (yellow (Y), magenta (M), cyan (C), and black (B)). Images thus formed are superimposed and transferred by the transfer rollers 430Y, 430M, 430C, and 430K onto the record sheet 32, which is transported by the ETB 409.

Moreover, at a downstream of the image formation units, a fixing device is disposed which contains a pair of a pressure roller 434 and a fixing roller 433 equipped with a heater 432 for heat-fixing of a toner image transferred onto the record sheet 32. The record sheet 32 on which an image is fixed by the fixing device, is discharged outside the apparatus by rotation of a fixing/discharge roller pair 435. A fixing/discharge sensor 436 detects transport status of the record sheet 32 from the fixing device.

Next, the configuration of each scanner unit 420Y-420K and each image formation unit will be described with reference to the scanner unit 420Y and image formation unit for yellow image formation. Since the scanner units and image formation units for other colors have similar configurations, descriptions thereof will be omitted. The scanner unit 420Y outputs laser light modulated based on an image signal sent out of a video controller 440, which will be described later. Thus, the scanner unit 420Y is equipped with a laser unit 421Y, a polygon mirror 422Y and a scanner motor 423Y for scanning a photoconductor drum 305Y with laser light from the laser unit 421Y, and a group of image formation lenses 424Y. The process cartridge 410Y is equipped with the photoconductor drum 305Y for carrying out electrophotographic processes, a charge roller 303Y, a developing roller 302Y, and a toner container 411Y. The process cartridge 410Y is detachable from the laser printer 401.

The video controller 440 receives image data sent out of an external apparatus (host computer) 441 such as a personal computer and rasterizes the image data to bitmap data in order to create an image signal for image formation. Reference numeral 201 denotes a control board, which is a control unit of the laser printer. The control board 201 includes an MPU (microcomputer) 207 equipped with RAM 207a, ROM 207b, a timer 207c, a digital I/O port 207d, and a D/A port 207e, and various I/O control circuits (not shown).

Moreover, a high voltage power supply unit 202 includes a power supply for high voltage charge (not shown) corresponding to each process cartridge, a high voltage power supply for development(not shown), and a high voltage power supply for transfer using a piezoelectric transformer that can output a high voltage corresponding to each transfer roller 430Y-430K.

Next, circuit configurations of the high voltage power supply unit 202 of the piezoelectric transformer type according to exemplary embodiments will be described. Since the circuit configurations of the high voltage power supply according to the exemplary embodiments are valid for both positive-voltage and negative-voltage output circuits, a high voltage power supply for transfer that requires the positive voltage will be described as an example below. In one embodiment, four circuits are provided as a high voltage power supply for transfer corresponding to each transfer roller 430Y, 430M, 430C, and 430K. Since the circuit configuration is identical in all circuits, only one circuit will be described.

First Exemplary Embodiment

Figure 1:
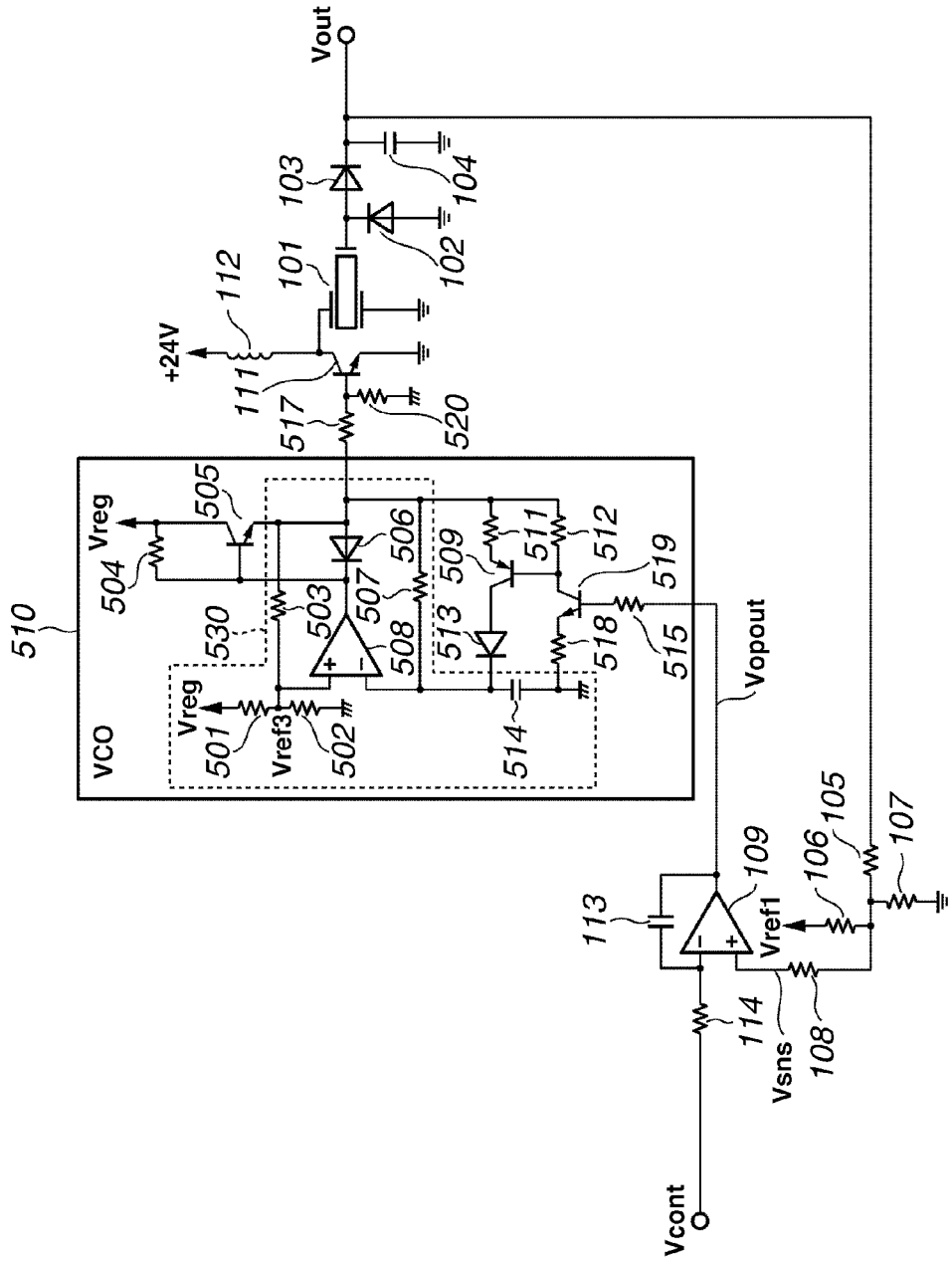
FIG. 1 is a diagram showing a high voltage power supply circuit of the piezoelectric transformer type employed for a high voltage power supply unit according to a first exemplary embodiment of the present invention.

FIG. 1 is a diagram showing a high voltage power supply circuit of the piezoelectric transformer type employed in the high voltage power supply unit 202 according to a first exemplary embodiment of the present invention. In FIG. 1, Reference numeral 101 denotes the piezoelectric transformer (piezoelectric ceramic transformer), Reference numerals 102, 103, 506, and 513 denote diodes, and Reference numerals 104, 113, and 514 denote capacitors. Reference numerals 105-108, 114, 501-504, 507, 511, 512, 515, 517, 518, and 520 denote resistors, Reference numeral 109 denotes an operational amplifier, and Reference numerals 111, 505, 509, and 519 denote transistors. Reference numeral 112 denotes an inductor, Reference numeral 508 denotes a comparator, Reference numeral 510 denotes a voltage controlled oscillator (VCO), and Reference numeral 530 denotes a CR oscillating circuit.

Output of the piezoelectric transformer 101 is rectified and smoothed to the positive voltage by the diodes 102 and 103 and the high voltage capacitor 104, and then supplied as the output voltage $V_{out}$ to a transfer roller (not shown), which serves as a load. Further, this output voltage $V_{out}$ is divided by the resistors 105, 106, and 107, and is input as the detection signal ($V_{sns}$) to the non-inverting input terminal (positive terminal) of the operational amplifier 109 via the protective resistor 108. The control signal ($V_{cont}$) of the high voltage power supply, which is an analog signal, is input to the inverting input terminal (negative terminal) of the operational amplifier 109 from the control board 201 (shown in FIG. 9) via the series resistor 114. Output ($V_{opout}$) of the operational amplifier 109 is connected to an input of the voltage controlled oscillator (VCO) 510. Output of the voltage controlled oscillator 510 is connected to a base of the transistor 111 via the resistor 517. A collector of the transistor 111 is connected to a power supply (+24 V) via the inductor 112 and to one side of the primary electrode of the piezoelectric transformer 101.

The other side of the primary electrode of the piezoelectric transformer 101 is grounded. An emitter of the transistor 111 is also grounded.

Figure 11:
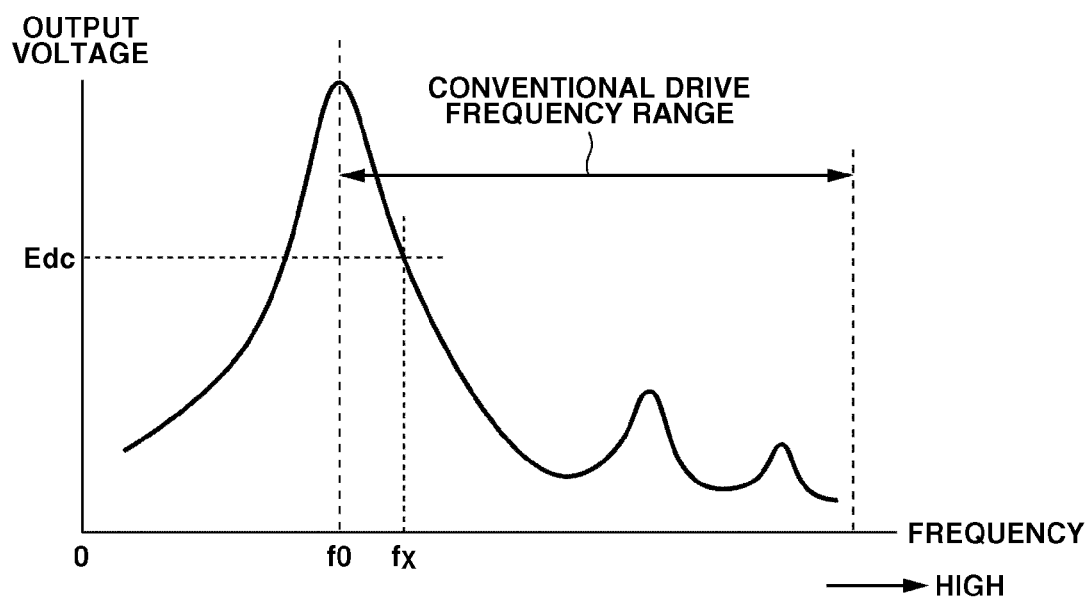
FIG. 11 is a diagram illustrating characteristics of the piezoelectric transformer.
Figure 12:
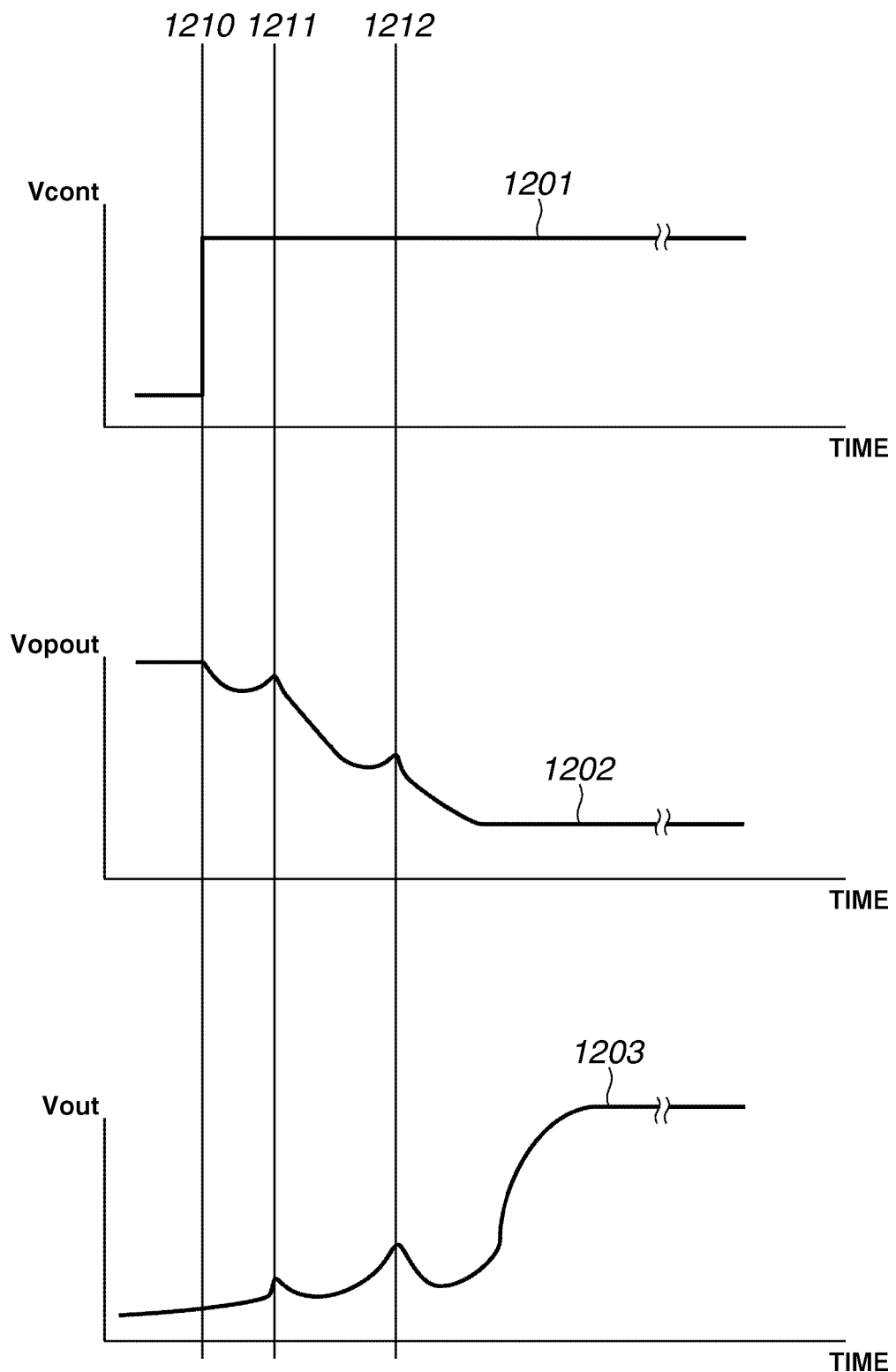
FIG. 12 is a diagram illustrating the output voltage-time characteristics of a conventional high voltage power supply of the piezoelectric transformer type.

In at least one embodiment of the present invention, output voltage-frequency characteristics of the piezoelectric transformer 101 are assumed to include the aforementioned characteristics shown in FIG. 11.

As shown in FIG. 11, it is evident that the output voltage is at its maximum at the resonant frequency f0 and the output voltage can be controlled by frequency. The drive frequency when a specified output voltage $E_{dc}$ is output is represented by $f_x$.

Figure 2:
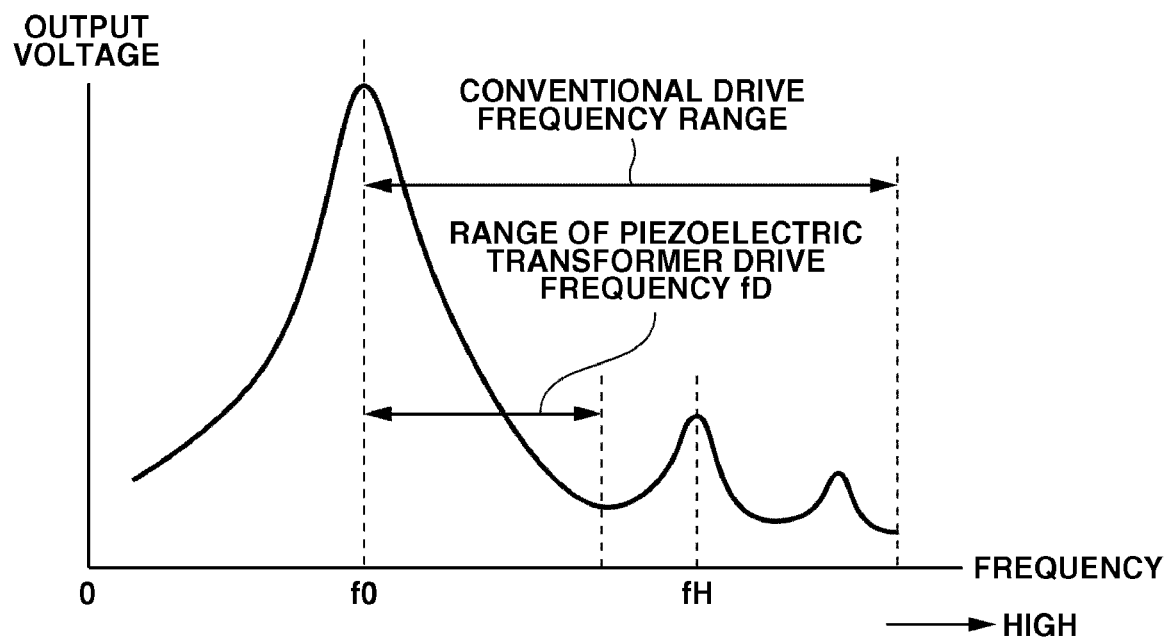
FIG. 2 is a diagram illustrating output voltage-frequency characteristics of the high voltage power supply of the piezoelectric transformer type according to the first exemplary embodiment.

The voltage control oscillator 510 is assumed to operate in such ways that an output frequency rises when an input voltage rises and the output frequency falls when the input voltage falls. Under such conditions, when the output voltage $V_{out}$ rises, the detection signal $V_{sns}$ of the non-inverting input terminal (positive terminal) of the operational amplifier 109 also rises via the resistor 105 and, as a result, the voltage at an output terminal of the operational amplifier 109 also rises. Since this raises also the input voltage of the voltage controlled oscillator 510, the drive frequency of the piezoelectric transformer 101 rises. Therefore, the piezoelectric transformer 101 is driven at a frequency that is a little higher than the drive frequency $f_x$, and the output voltage thereof falls slightly. In this way, when the output voltage $V_{out}$ rises, the output voltage is controlled to lower itself (FIG. 2). That is, a negative feedback control circuit is formed.

When the output voltage $V_{out}$ falls, the detection signal $V_{sns}$ to the operational amplifier 109 falls and the output voltage of the operational amplifier 109 also falls. Since this raises the output frequency of the voltage controlled oscillator 510, the output voltage $V_{out}$ is controlled to raise itself (FIG. 2).

In this way, the output voltage $V_{out}$ of the high voltage power supply circuit of the piezoelectric transformer type is controlled and kept at constant voltage, so that it equals a voltage determined by the voltage of the control signal ($V_{cont}$) from the control board 201 which is input to the inverting input terminal (negative terminal) of the operational amplifier 109.

FIG. 2 is a diagram illustrating the output voltage-frequency characteristics of the high voltage power supply of the piezoelectric transformer type according to the first exemplary embodiment.

The diagram shows a relationship between the drive frequency and output voltage on the frequency side which is higher than the resonant frequency $f_0$ of a piezoelectric ceramic vibration body. When $f_H$ represents a higher-frequency-region spurious frequency on the higher frequency side that is closest to the resonant frequency $f_0$ of the piezoelectric ceramic vibration body, the range of the piezoelectric transformer drive frequency $f_D$ can be represented by a formula 1:

$$f_0 < f_D < f_H \quad (1)$$

An initial value of the drive frequency $f_D$ of the piezoelectric transformer 101 when the high voltage power supply of the image forming apparatus is turned on, is set to be on the frequency side lower than $f_H$. This frequency is defined to be an upper limit of the range of the drive frequency $f_D$ of the piezoelectric transformer 101. When the capacitance and resistance of the capacitor 514 and resistor 507 are selected, a CR time constant of the capacitor 514 and resistor 507 are appropriately chosen so that the upper limit of the drive frequency $f_D$ can be set to be on the frequency side which is lower than $f_H$.

Figure 3:
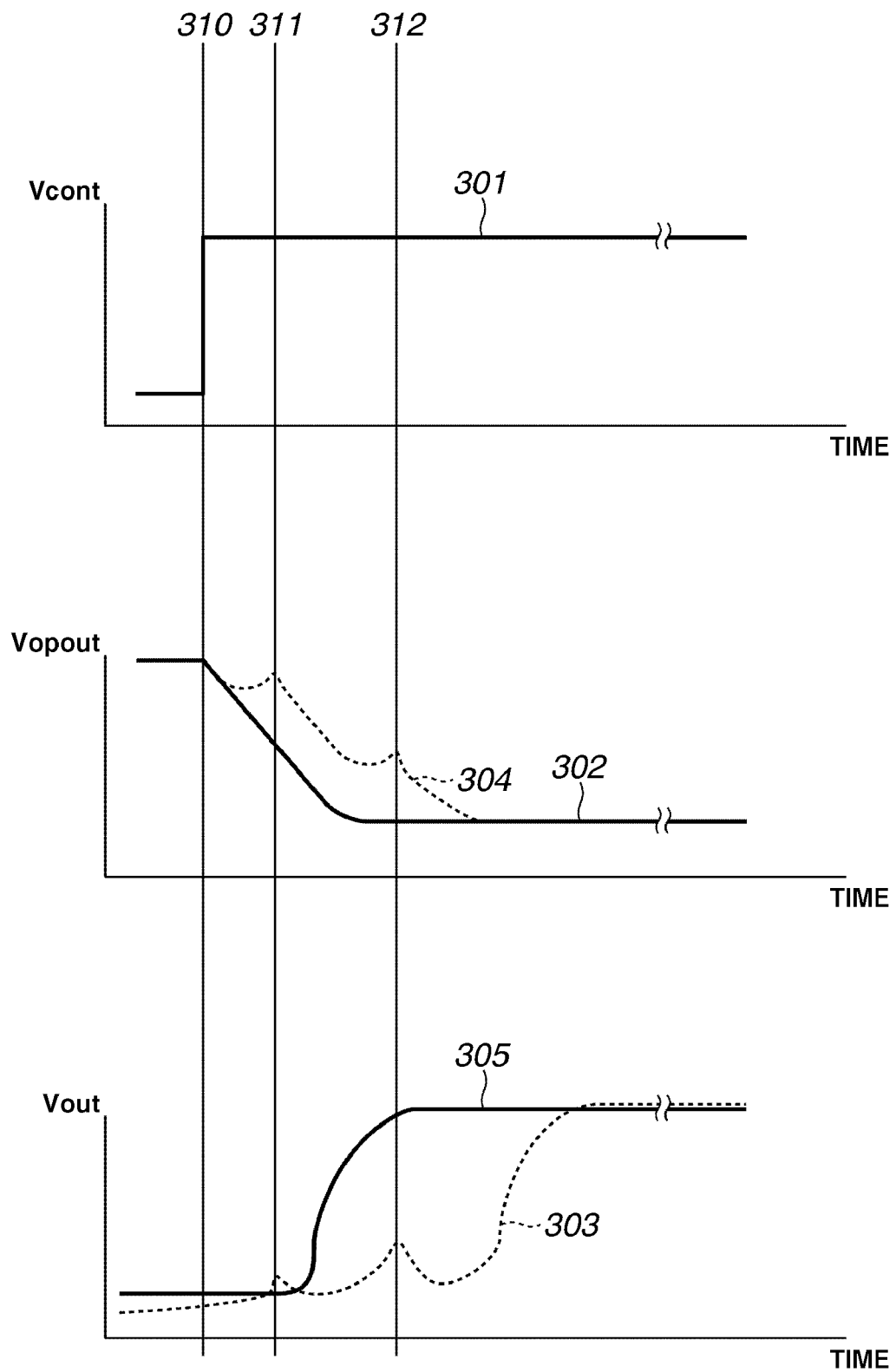
FIG. 3 is a diagram illustrating output voltage-time characteristics of the high voltage power supply of the piezoelectric transformer type according to the first exemplary embodiment.

FIG. 3 is a diagram illustrating the output voltage-time characteristics of the high voltage power supply of the piezoelectric transformer type according to the first exemplary embodiment.

A solid line 301 indicates a waveform of the control signal $V_{cont}$ of the high voltage power supply, which is an analog signal and supplied from the control board 201. A broken line 304 indicates a waveform of the output voltage $V_{opout}$ of a conventional operational amplifier (when the frequency is variable in the conventional drive frequency range in FIG. 2) and a broken line 303 indicates a waveform of a conventional output voltage $V_{out}$ (when the frequency is variable in the conventional drive frequency range in FIG. 2). A solid line 302 indicates a waveform of the output voltage $V_{opout}$ of the operational amplifier 109 according to the exemplary embodiments and Reference numeral 305 indicates a waveform of the output voltage $V_{out}$ according to the exemplary embodiments. Reference numeral 310 indicates the timing of turning-on of the high voltage power supply, and Reference numerals 311 and 312 indicate the timings of passing of spurious frequencies during rise time of the output voltage when the frequency in the conventional drive frequency range in FIG. 2 is variable.

In the first exemplary embodiment, the initial drive frequency is set to be on the frequency side that is lower than $f_H$. Since this prevents the process of sweeping through the drive frequencies from passing spurious frequencies, the output voltage rises in a behavior shown by the waveform 305 of the output voltage $V_{out}$ when the high voltage power supply is turned on (310). As a result, when compared with the waveform 303 of the conventional output voltage $V_{out}$, the rise time of the output voltage $V_{out}$ can be shortened.

Second Exemplary Embodiment

A main difference of the second exemplary embodiment from the first exemplary embodiment is to set the range of the drive frequency $f_D$ of the piezoelectric transformer 101 to be on the frequency side that is lower than the resonant frequency $f_0$ of the piezoelectric ceramic vibration body.

Figure 4:
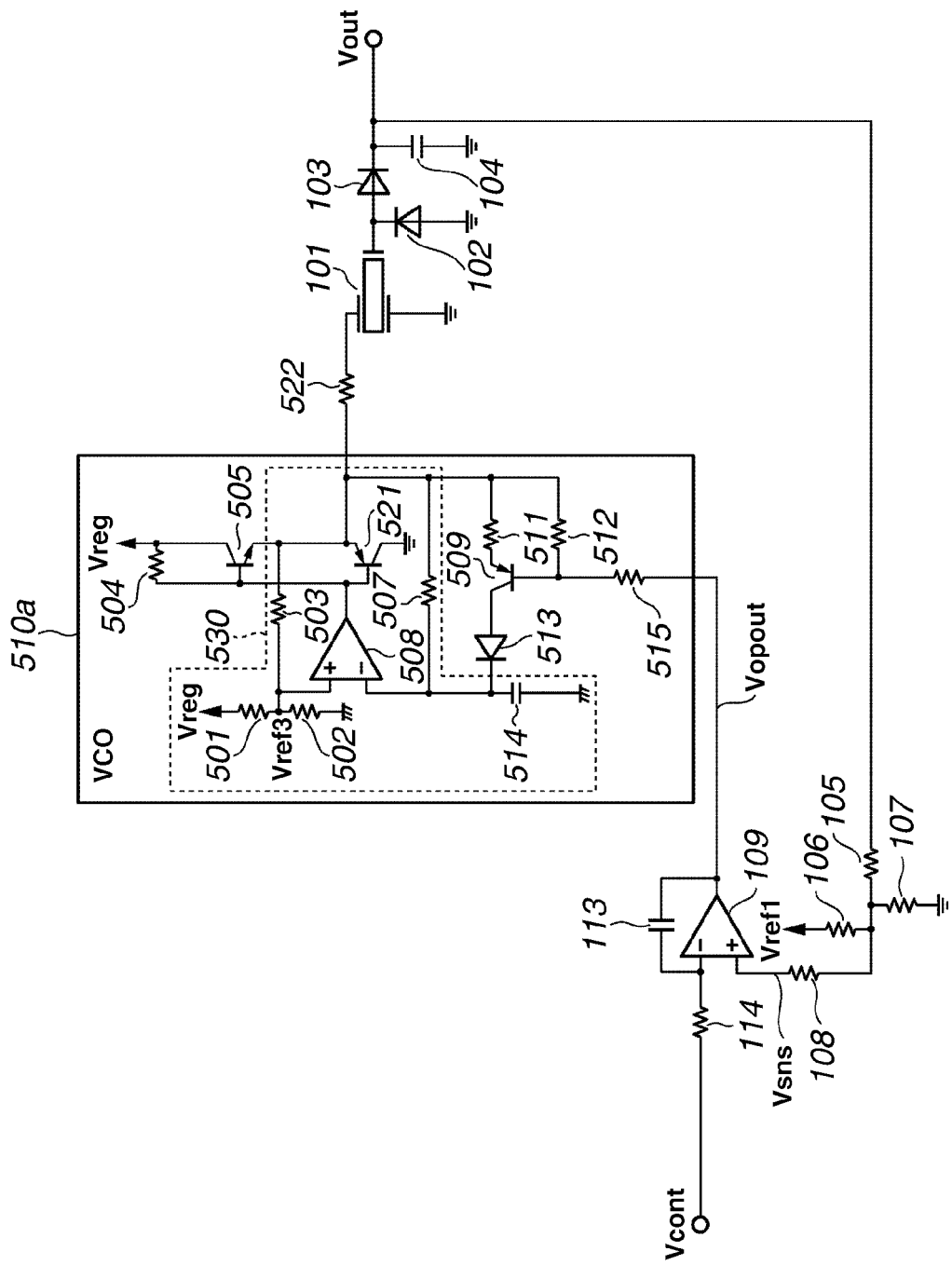
FIG. 4 is a diagram showing a high voltage power supply circuit of the piezoelectric transformer type according to a second exemplary embodiment of the present invention.

FIG. 4 is a diagram showing a high voltage power supply circuit of the piezoelectric transformer type according to the second exemplary embodiment of the present invention.

The circuit illustrated in FIG. 4 includes a push-pull circuit configured by transistors 505 and 521 without using the transistor 111 and inductor 112 in FIG. 1 of the first exemplary embodiment. The piezoelectric transformer is pulse-driven directly by a source voltage via a resistor 522.

According to the second exemplary embodiment, the piezoelectric transformer 101 is driven in the frequency range on the lower frequency side of the resonant frequency $f_0$. In contrast to the VCO 510 according to the first exemplary embodiment, a voltage controlled oscillator (VCO) 510a according to the second exemplary embodiment is assumed to operate in such ways that the output frequency falls when the input voltage rises, and the output frequency rises when the input voltage falls. For other circuit components than the above mentioned, the same symbols are used for the similar components as in the first exemplary embodiment and descriptions thereof will not be repeated.

Figure 5:
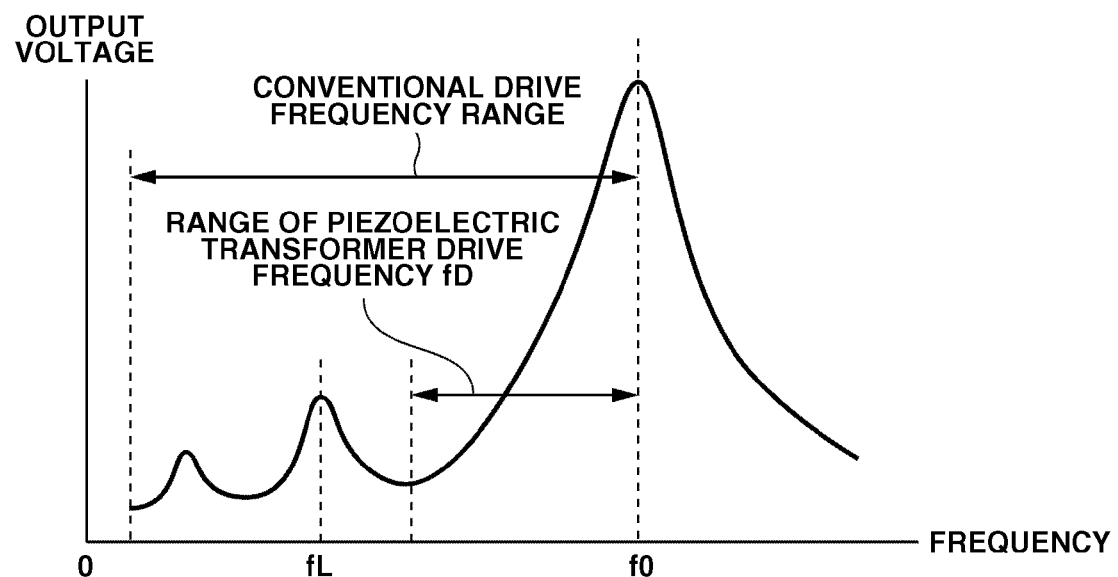
FIG. 5 is a diagram illustrating the output voltage-frequency characteristics of the high voltage power supply of the piezoelectric transformer type according to the second exemplary embodiment.

FIG. 5 is a diagram illustrating the output voltage-frequency characteristics of the high voltage power supply of the piezoelectric transformer type according to the second exemplary embodiment.

When the resonant frequency of the piezoelectric ceramic vibration body is represented by f0, and a lower-region spurious frequency that is the closest on the lower frequency side is represented by $f_L$, the range of the piezoelectric transformer drive frequency $f_D$ can be represented by a formula 2:

$$f_L < f_D < f_0 \quad (2)$$

A lower limit operating frequency of the VCO 510a is determined by the CR time constant of the capacitor 514 and resistor 507. The initial value of the drive frequency $f_D$ Of the piezoelectric transformer 101 when the high voltage power supply of the image forming apparatus is turned on, is set to be on the frequency side that is higher than $f_L$. This frequency is defined to be an lower limit of the range of the drive frequency $f_D$ of the piezoelectric transformer 101. The CR time constant of the capacitor 514 and resistor 507 is determined in this way, and the drive frequency $f_D$ of the piezoelectric transformer 101 can be set to be on the frequency side that is higher than $f_L$.

Figure 6:
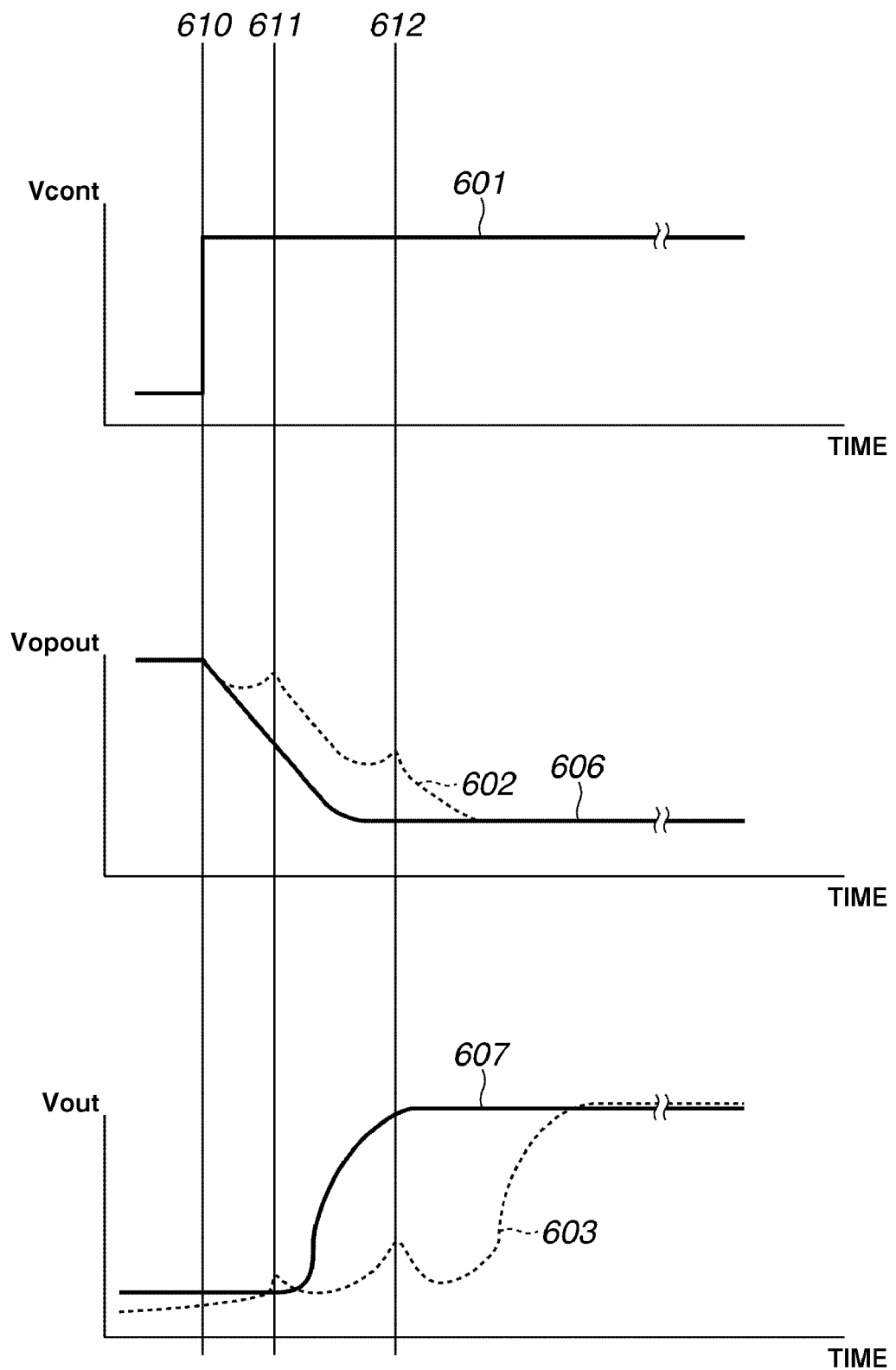
FIG. 6 is a diagram illustrating the output voltage-time characteristics of the high voltage power supply of the piezoelectric transformer type according to the second exemplary embodiment.

FIG. 6 is a diagram showing the output voltage-time characteristics of the high voltage power supply of the piezoelectric transformer type according to the second exemplary embodiment.

A solid line 601 shows a waveform of the control signal $V_{cont}$ of the high voltage power supply, which is an analog signal and is supplied from the control board 201. A broken line 602 indicates a waveform of the output voltage $V_{opout}$ of a conventional (when variable control of the frequency is performed within the range shown in "conventional drive frequency range" in FIG. 5) operational amplifier and a broken line 603 indicates a waveform of the conventional output voltage $V_{out}$. A solid line 606 indicates a waveform of the output voltage $V_{opout}$ of an operational amplifier 508 according to the second exemplary embodiment and a solid line 607 indicates a waveform of the output voltage $V_{out}$ according to the second exemplary embodiment. Reference numeral 610 indicates the time of turning-on of the high voltage power supply, and Reference numerals 611 and 612 indicate the timings at which drive frequencies to be swept during rise time of the output voltage pass spurious frequencies when variable control of the frequency is performed in the range shown in "conventional drive frequency range" of FIG. 5.

In the second exemplary embodiment, as shown in FIG. 5, the initial drive frequency is set to be on the frequency side that is higher than $f_L$. Since this prevents the sweeping process from passing spurious frequencies, the output voltage rises in a behavior shown by the waveform 607 of the output voltage $V_{out}$ when the high voltage power supply is turned on (610). As a result, in comparison with the waveform 603 of the conventional output voltage $V_{out}$, the rise time of the output voltage $V_{out}$ can be shortened.

Third Exemplary Embodiment

According to the first or second exemplary embodiment, the piezoelectric transformer 101 operates even if the control signal $V_{cont}$ is 0 V, and a micro output voltage $V_{cont}$ is maintained. Therefore, the output voltage $V_{out}$ will not become completely 0 V. Consequently, a voltage is always applied to process members such as photoreceptors and transfer rollers of an electrophotographic printer. This state shortens a life of process members. It is also a problem that power is uselessly consumed due to a continuous operation of the piezoelectric transformer 101.

Thus, in the configurations described in the first or second exemplary embodiment, the output voltage $V_{out}$ is set completely to 0 V according to the third exemplary embodiment when the output voltage $V_{out}$ falls to a prescribed voltage below the output voltage used for image forming operations.

The third exemplary embodiment is applicable to both configurations in which the piezoelectric transformer 101 is controlled on the frequency side higher than the resonant frequency f0 of the piezoelectric ceramic vibration body (first exemplary embodiment) and in which the piezoelectric transformer 101 is controlled on the frequency side lower than the resonant frequency f0 of the piezoelectric ceramic vibration body (second exemplary embodiment). However, in a following case, the piezoelectric transformer 101 is controlled on the frequency side higher than the resonant frequency f0 of the piezoelectric ceramic vibration body.

Figure 7:
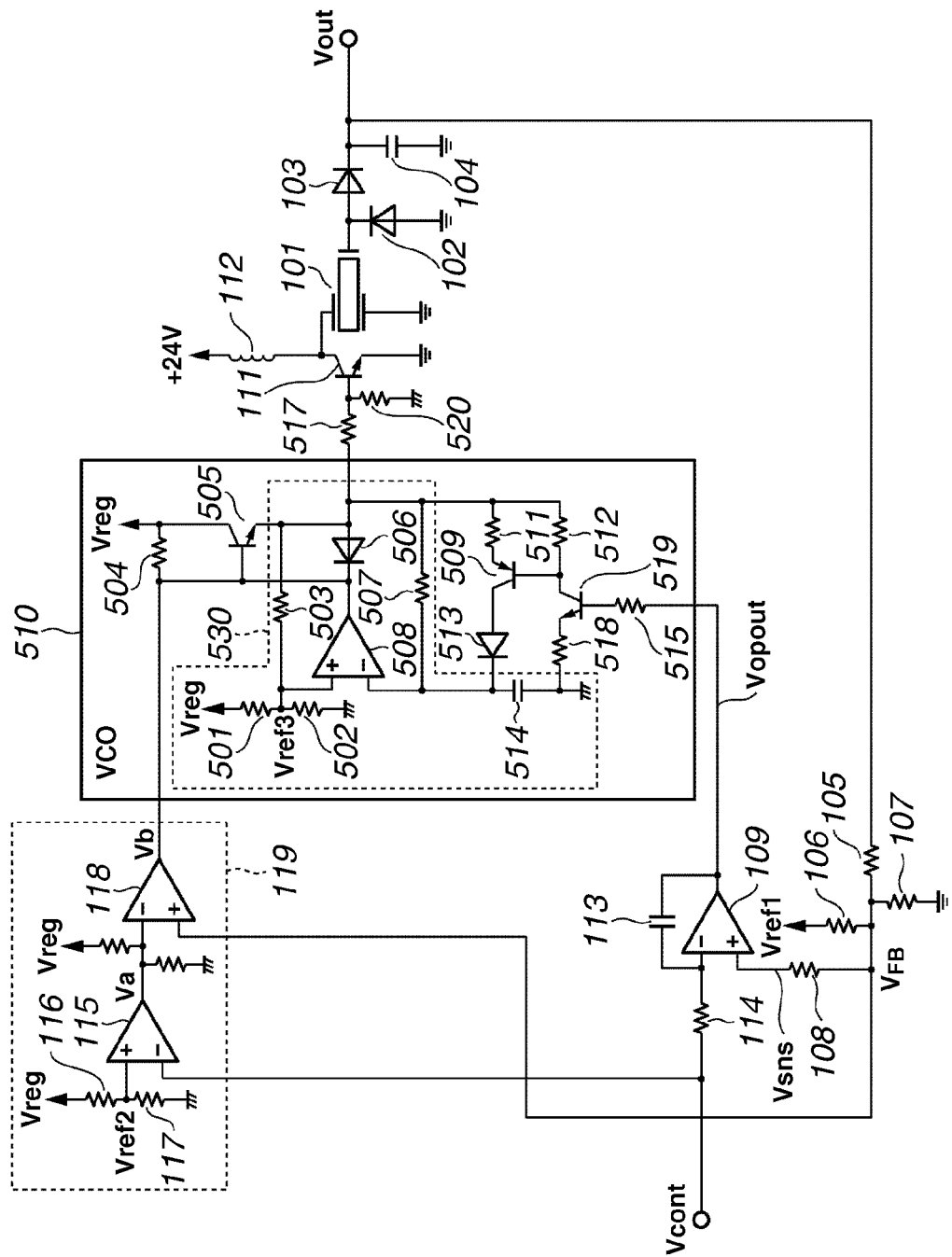
FIG. 7 is a diagram illustrating a high voltage power supply circuit of the piezoelectric transformer type according to a third exemplary embodiment of the present invention.

FIG. 7 is a diagram illustrating a high voltage power supply circuit of the piezoelectric transformer type according to a third exemplary embodiment. The same symbols and reference numerals are used for the similar components as in FIG. 1 and descriptions thereof will not be repeated.

The third exemplary embodiment will be described emphasizing an output voltage stop circuit 119.

The output voltage stop circuit 119 uses a comparator 115 to compare a reference voltage $V_{ref2}$ determined by a source voltage $V_{reg}$ of a control system and the resistance of resistors 116 and 117, with the voltage of the control signal $V_{cont}$. The comparison result (output voltage $V_a$ of the comparator 115) is compared with a detection voltage $V_{FB}$ of the output voltage $V_{out}$ by a comparator 118. Then, an output voltage ($V_b$) of the comparator 118 is input into the CR oscillating circuit 530 which is reflected in output. That is, if the voltage of the control signal $V_{cont}$ is higher than the reference voltage $V_{ref2}$, the output voltage $V_a$ of the comparator 115 falls to almost 0 V. Thus, if the output voltage $V_{out}$ is equal to or higher than 0 V, the VCO 510 operates normally. On the other hand, if the voltage of the control signal $V_{cont}$ is lower than the reference voltage $V_{ref2}$, the output voltage $V_a$ of the comparator 115 becomes the prescribed voltage $V_{th}$. If the output voltage $V_{out}$ falls below the voltage $V_{th}$ in this state, the output voltage $V_b$ of an operational amplifier 118 becomes 0 V and no frequency signal is output from the VCO 510.

Figure 8:
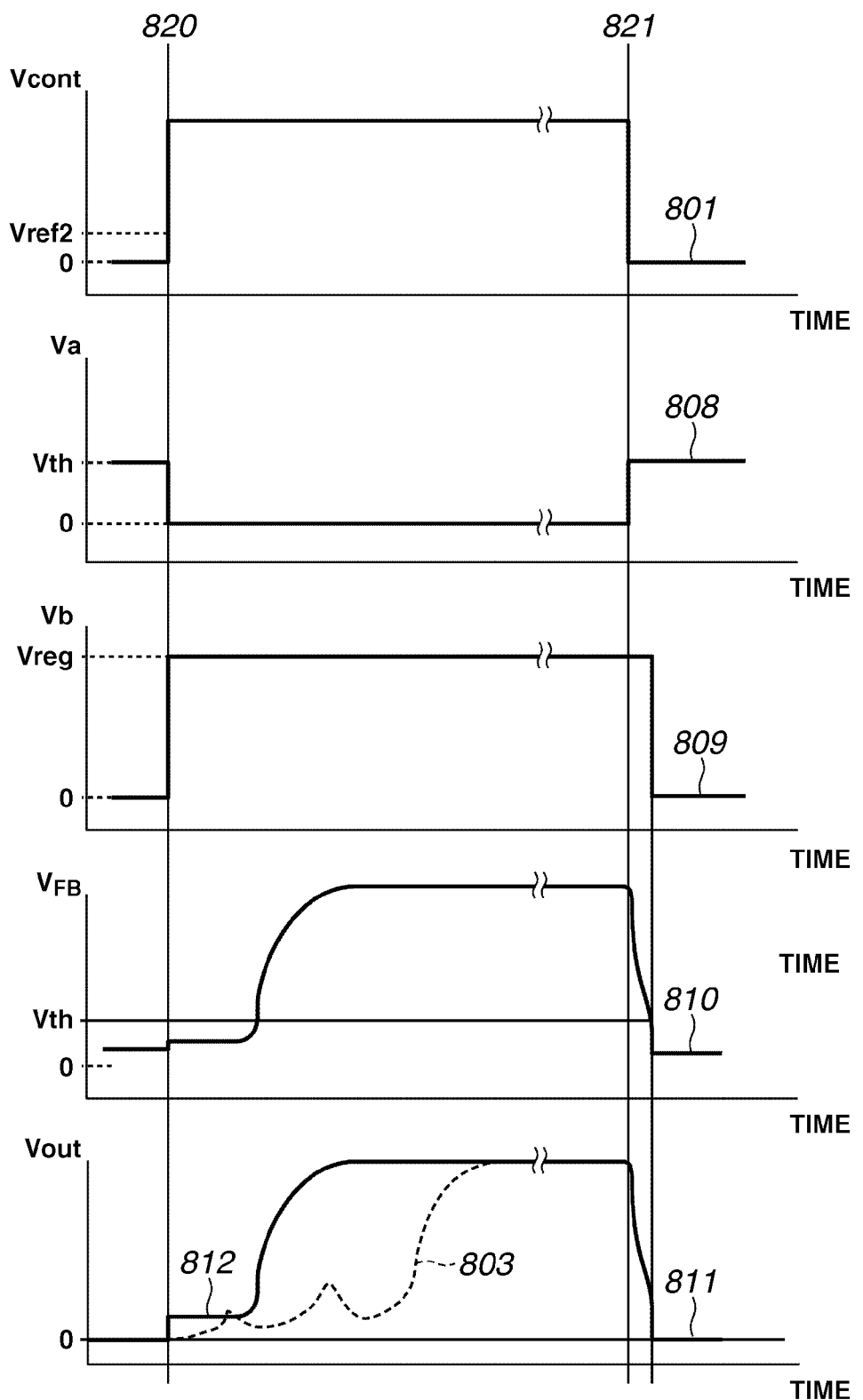
FIG. 8 is a diagram illustrating the output voltage-time characteristics of the high voltage power supply of the piezoelectric transformer type according to the third exemplary embodiment.

FIG. 8 is a diagram illustrating the output voltage-time characteristics of the high voltage power supply of the piezoelectric transformer type according to the third exemplary embodiment.

Reference numeral 801 indicates a waveform of the control signal $V_{cont}$ of the high voltage power supply, which is an analog signal and is supplied from the control board 201. Reference numeral 803 denotes a waveform of the conventional output voltage $V_{opout}$. Reference numeral 808 denotes a waveform of the output voltage $V_a$ of comparator 115 according to the third exemplary embodiment. Reference numeral 809 denotes a waveform of the output voltage $V_b$ of comparator 118 according to the third exemplary embodiment. Further, reference numeral 810 denotes a waveform of the detection voltage $V_{FB}$ according to the third exemplary embodiment and Reference numeral 811 denotes a waveform of the output voltage $V_{out}$ according to the third exemplary embodiment. Reference numeral 820 denotes timing when the high voltage power supply is turned on and Reference numeral 821 denotes timing when the high voltage power supply is turned off.

In such a configuration, the value of the reference voltage $V_{ref2}$ is set so that the output voltage $V_{out}$ becomes 0 V when the output voltage $V_{out}$ falls to a prescribed voltage below the output voltage used for image forming operations. The detection voltage $V_{FB}$ corresponding to a threshold value of the output voltage $V_{out}$ is set to $V_{th}$.

Operations according to the third embodiment will be described below with reference to FIGS. 7 and 8.

When the high voltage power supply is turned on (820), the voltage of the control signal $V_{cont}$ (801) from a control unit rises to a high level. Consequently, the output voltage $V_a$ (808) of the comparator 115 becomes 0 V and the output voltage $V_b$ (809) of the comparator 118 becomes $V_{reg}$. Then, when the detection voltage $V_{FB}$ (810) starts to rise, the output voltage $V_{out}$ (811) rises in an increment of the reference voltage $V_{ref2}$ (812). Then, the voltage rises to a desired output voltage $V_{out}$.

Next, when the high voltage power supply is turned off (821), the value of the control signal $V_{cont}$ (801) from the control unit becomes 0 V. As its result, the output voltage $V_a$ (808) of the comparator 115 becomes $V_{th}$. Then, the detection voltage $V_{FB}$ 810 starts to fall, and when the detection voltage falls below the threshold voltage $V_{th}$, the output voltage $V_b$ (809) of the comparator 118 becomes 0 V. Consequently, the detection voltage $V_{FB}$ (810) falls instantaneously to the initial value (0 V) of $V_{FB}$. At the same time, the output voltage $V_{out}$ (811) also instantaneously falls to 0 V.

Accordingly, the output (809) of the comparator 118 becomes almost 0 V when the control signal $V_{cont}$ (801) shown in FIG. 8 is smaller than the reference voltage $V_{ref2}$ and the detection voltage $V_{FB}$ (810) is smaller than the prescribed voltage $V_{th}$. As a result, a base potential of the transistor 111 falls and oscillation is stopped and driving of the piezoelectric transformer 101 is stopped. Consequently, the output voltage $V_{out}$ 811 becomes almost 0 V and its output is stopped.

If the control signal $V_{cont}$ (801) is higher than the reference voltage $V_{ref2}$ or the detection voltage $V_{FB}$ (810) is higher than the prescribed threshold voltage $V_{th}$, the output voltage stop circuit 119 does not operate and the same output is obtained as in the aforementioned circuits according to the first exemplary embodiment.

The third exemplary embodiment has been described with the configuration in which the drive frequency of the piezoelectric transformer 101 is controlled in the frequency region higher than the resonant frequency f0. However, the present invention is not limited to such a method. As described in the second description, the drive frequency can be controlled in the frequency region lower than the resonant frequency f0.

The first to third exemplary embodiments have been described with the configurations employing constant voltage control, but the present invention is not limited to such configurations. Similar effects can be obtained by employing a constant current control.

The image forming apparatus according to the first to third exemplary embodiments has been described by taking the tandem color image forming apparatus as an example, but any image forming apparatus using a high voltage bias can be included in the present invention.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims priority from Japanese Patent Application No. 2005-200646 filed Jul. 8, 2005, which is hereby incorporated by reference herein in its entirety.

What is claimed is:

1. A power supply device that generates an output voltage by driving a piezoelectric transformer using a frequency signal, comprising:
   a comparison unit configured to compare an output voltage and a voltage setting signal that sets the output voltage; and
   a voltage control oscillation unit configured to generate the frequency signal to drive the piezoelectric transformer based on comparison results of the comparison unit,
   wherein frequency characteristics of the piezoelectric transformer when driving the piezoelectric transformer using the frequency signal include a resonant frequency of the piezoelectric transformer at which a maximum voltage is output and a plurality of spurious resonant frequencies of the piezoelectric transformer, the plurality of spurious resonant frequencies being higher than the resonant frequency and at which a voltage lower than the maximum voltage is output, and
   wherein the voltage control oscillation unit generates the frequency signal within a range between the resonant frequency and a closest spurious resonant frequency to the resonant frequency among the plurality of spurious resonant frequencies, sets an initial frequency of the frequency signal for driving the piezoelectric transformer to be lower than the closest spurious resonant frequency, and sweeps a frequency from the set initial frequency to a frequency corresponding to a target voltage.

2. The power supply device according to claim 1, wherein the voltage control oscillation unit includes one or more components configured to prevent a frequency of the frequency signal generated by the voltage control oscillation unit from rising higher than the closest spurious resonant frequency.

3. The power supply device according to claim 1,
   wherein the voltage control oscillation unit includes a capacitor and a resistor, and
   wherein a capacitance value of the capacitor and a resistance value of the resistor are selected such that a frequency of the frequency signal generated by the voltage control oscillation unit is prevented from rising higher than the closest spurious resonant frequency.

4. The power supply device according to claim 1, wherein the voltage control oscillation unit causes a frequency of the frequency signal to rise when an input voltage rises, and causes the frequency of the frequency signal to fall when the input voltage falls.

5. The power supply device according to claim 1, further comprising a unit that stops an operation of the voltage control oscillation unit when the voltage setting signal is equal to or less than a prescribed value and the output voltage is equal to or less than the prescribed value.

6. A power supply device that generates an output voltage by driving a piezoelectric transformer using a frequency signal, comprising:
   a comparison unit configured to compare the output voltage and a voltage setting signal that sets the output voltage; and
   a voltage control oscillation unit configured to generate the frequency signal to drive the piezoelectric transformer based on comparison results of the comparison unit,
   wherein frequency characteristics of the piezoelectric transformer when driving the piezoelectric transformer using the frequency signal include a resonant frequency of the piezoelectric transformer at which a maximum voltage is output and a plurality of spurious resonant frequencies of the piezoelectric transformer, the plurality of spurious resonant frequencies being lower than the resonant frequency and at which a voltage lower than the maximum voltage is output, and
   wherein the voltage control oscillation unit generates the frequency signal within a range between the resonant frequency and a closest spurious resonant frequency to the resonant frequency among the plurality of spurious resonant frequencies, sets an initial frequency of the frequency signal for driving the piezoelectric transformer to be higher than the closest spurious resonant frequency, and sweeps a frequency from the set initial frequency to a frequency corresponding to a target voltage.

7. The power supply device according to claim 6, wherein the voltage control oscillation unit includes one or more components configured to prevent a frequency of the frequency signal generated by the voltage control oscillation unit from falling lower than the closest spurious resonant frequency.

8. The power supply device according to claim 6,
wherein the voltage control oscillation unit includes a capacitor and a resistor, and
wherein a capacitance value of the capacitor and a resistance value of the resistor are selected such that a frequency of the frequency signal generated by the voltage control oscillation unit is prevented from falling lower than the closest spurious resonant frequency.

9. The power supply device according to claim 6, wherein the voltage control oscillation unit causes the frequency of the frequency signal to fall when the input voltage rises, and causes the frequency of the frequency signal to rise when the input voltage falls.

10. The power supply device according to claim 6, further comprising the unit that stops the operation of the voltage control oscillation unit when the voltage setting signal is equal to or less than the prescribed value and the output voltage is equal to or less than the prescribed value.

11. An image forming apparatus comprising:
a latent image forming unit configured to form an electrostatic latent image on an image carrier;
a development unit to form a toner image in the electrostatic latent image;
a transfer unit configured to transfer the toner image onto a transfer member;
a fixing unit configured to fix the toner image by heating the transfer member onto which the toner image has been transferred;
a transport unit configured to transport the transfer member; and
a power supply device that generates an output voltage by driving a piezoelectric transformer using a frequency signal and supplies the output voltage to at least one of the development unit, the transfer unit, and the fixing unit,
wherein the power supply device comprises a comparison unit configured to compare the output voltage and a voltage setting signal that sets the output voltage, and a voltage control oscillation unit configured to generate the frequency signal to drive the piezoelectric transformer based on comparison results of the comparison unit, and
wherein frequency characteristics of the piezoelectric transformer when driving the piezoelectric transformer using the frequency signal include a resonant frequency of the piezoelectric transformer at which a maximum voltage is output and a plurality of spurious resonant frequencies of the piezoelectric transformer, the plurality of spurious resonant frequencies being different from the resonant frequency and at which a voltage lower than the maximum voltage is output, and
wherein the voltage control oscillation unit generates the frequency signal in a range between the resonant frequency and a closest spurious resonant frequency to the resonant frequency among the plurality of spurious resonant frequencies, sets an initial frequency of the frequency signal for driving the piezoelectric transformer to be different from the closest spurious resonant frequency, and sweeps a frequency from the set initial frequency to a frequency corresponding to a target voltage.

12. The image forming apparatus according to claim 11,
wherein the voltage control oscillation unit generates the frequency signal in a higher frequency region than the resonant frequency within the range between the resonant frequency and the closest spurious resonant frequency, and
wherein the voltage control oscillation unit causes the frequency of the frequency signal to rise when an input voltage of the voltage control oscillation unit rises, and causes the frequency of the frequency signal to fall when the input voltage falls.

13. The image forming apparatus according to claim 11,
wherein the voltage control oscillation unit generates the frequency signal to drive the piezoelectric transformer in a lower frequency region than the resonant frequency within the range between the resonant frequency and the closest spurious resonant frequency, and
wherein the voltage control oscillation unit causes the frequency of the frequency signal to fall when an input voltage of the voltage control oscillation unit rises, and causes the frequency of the frequency signal to rise when the input voltage falls.

14. The image forming apparatus according to claim 11, further comprising a unit that stops an operation of the voltage control oscillation unit when the voltage setting signal is equal to or less than a prescribed value and the output voltage is equal to or less than the prescribed value.

15. A power supply device comprising:
a piezoelectric transformer; and
a voltage control oscillation unit coupled to the piezoelectric transformer, the voltage control oscillation unit configured to generate a frequency signal to drive the piezoelectric transformer, the voltage control oscillation unit capable of varying a frequency of the frequency signal based on an output voltage of the piezoelectric transformer and a voltage setting signal,
wherein frequency characteristics of the piezoelectric transformer when driving the piezoelectric transformer using the frequency signal include a resonant frequency of the piezoelectric transformer at which a maximum voltage is output and a plurality of spurious resonant frequencies of the piezoelectric transformer, the plurality of spurious resonant frequencies being different from the resonant frequency and at which a voltage lower than the maximum voltage is output, and
wherein the voltage control oscillation unit generates the frequency signal within a range between the resonant frequency a closest spurious resonant frequency to the resonant frequency among the plurality of spurious resonant frequencies, sets an initial frequency of the frequency signal for driving the piezoelectric transformer to be different from the closest spurious resonant frequency, and sweeps a frequency from the set initial frequency to a frequency corresponding to a target voltage.

16. The power supply device according to claim 15, wherein the voltage control oscillation unit generates the frequency signal in a higher frequency region than the resonant frequency of the piezoelectric transformer.

17. The power supply device according to claim 16, wherein the voltage control oscillation unit causes the frequency of the frequency signal to rise when an input voltage of the voltage control oscillation unit rises, and causes the frequency of the frequency signal to fall when the input voltage falls.

18. The power supply device according to claim 15, wherein the voltage control oscillation unit generates the frequency signal in a lower frequency region than the resonant frequency of the piezoelectric transformer.

19. The power supply device according to claim 18, wherein the voltage control oscillation unit causes the frequency of the frequency signal to fall when an input voltage of the voltage control oscillation unit rises, and causes the frequency of the frequency signal to rise when the input voltage falls.

20. An image forming apparatus comprising:
a latent image forming unit configured to form an electrostatic latent image on an image carrier;
a development unit configured to form a toner image of the electrostatic latent image;
a transfer unit configured to transfer the toner image onto a transfer member;
a fixing unit configured to fix the toner image by heating the transfer member onto which the toner image has been transferred;
a transport unit configured to transport the transfer member; and
a power supply device to supply a high voltage to at least one of the development unit, transfer unit, and fixing unit,
wherein the power supply device comprises a piezoelectric transformer and a voltage control oscillation unit coupled to the piezoelectric transformer, the voltage control oscillation unit to generate a frequency signal that drives the piezoelectric transformer, the voltage control oscillation unit capable of varying a frequency of the frequency signal based on an output voltage of the piezoelectric transformer and a voltage setting signal, and
wherein frequency characteristics of the piezoelectric transformer when driving the piezoelectric transformer using the frequency signal include a resonant frequency of the piezoelectric transformer at which a maximum voltage is output and a plurality of spurious resonant frequencies of the piezoelectric transformer, the plurality of spurious resonant frequencies being different from the resonant frequency and at which a voltage lower than the maximum voltage is output, and
wherein the voltage control oscillation unit generates the frequency signal within a range between the resonant frequency and a closest spurious resonant frequency to the resonant frequency among the plurality of spurious resonant frequencies, sets an initial frequency of the frequency signal for driving the piezoelectric transformer to be different from the closest spurious resonant frequency, and sweeps a frequency from the set initial frequency to a frequency corresponding to a target voltage.

21. The image forming apparatus according to claim 20, wherein the voltage control oscillation unit generates the frequency signal in a higher frequency region than the resonant frequency of the piezoelectric transformer, and wherein the voltage control oscillation unit causes the frequency of the frequency signal to rise when an input voltage of the voltage control oscillation unit rises, and causes the frequency of the frequency signal to fall when the input voltage falls.

22. The power supply device according to claim 20, wherein the voltage control oscillation unit generates the frequency signal in a lower frequency region than the resonant frequency of the piezoelectric transformer, and wherein the voltage control oscillation unit causes the frequency of the frequency signal to fall when an input voltage of the voltage control oscillation unit rises, and causes the frequency of the frequency signal to rise when the input voltage falls.

* * * * *